United States Patent [19]
Knudson et al.

[11] 3,975,561
[45] Aug. 17, 1976

[54] PHOTOPOLYMER IMAGE INLAYS

[76] Inventors: Richard C. Knudson, 4330 Lynne Lane, Salt Lake City, Utah 84117; John R. Bolton, 1528 Vine St., Belmont, Calif. 94002

[22] Filed: Nov. 21, 1974

[21] Appl. No.: 525,860

[52] U.S. Cl. .................................. 428/67; 96/33; 96/35.1; 101/457; 428/46; 428/187; 428/199; 428/207; 428/323; 428/482
[51] Int. Cl.² ...................... G03C 1/68; B44F 1/06; B32B 27/36
[58] Field of Search ............ 428/67, 913, 482, 908, 428/909, 914, 13–15, 29–31, 46, 202, 204, 207, 187, 199, 240, 323; 96/35.1, 33, 115 P; 101/457

[56] References Cited
UNITED STATES PATENTS

| | | | |
|---|---|---|---|
| 3,429,732 | 2/1969 | Baitinger | 428/913 X |
| 3,620,812 | 11/1971 | Boutle et al. | 428/451 |
| 3,660,211 | 5/1972 | Brody | 428/67 |
| 3,926,640 | 12/1975 | Rosen | 96/35.1 X |
| 3,933,746 | 1/1976 | Steele | 428/482 X |
| 3,935,330 | 1/1976 | Smith et al. | 96/115 P |

*Primary Examiner*—Harold Ansher
*Attorney, Agent, or Firm*—Criddle, Thorpe & Western

[57] ABSTRACT

Photopolymeric image inlay articles comprising a photopolymeric image inlaid into a resilient polyester resin coated matrix of a solidified synthetic rock-like mixture.

10 Claims, No Drawings

PHOTOPOLYMER IMAGE INLAYS

BACKGROUND OF THE INVENTION

This invention relates to photopolymeric images inlaid into solid synthetic rock-like structures. More specifically, this invention relates to a photopolymeric image or design which is inlaid into a solid matrix of a synthetic rock-like structure consisting of a filler in a thermosetting resin.

It has been known to produce decorative plaques, plates and the like, wherein an image, writing, picture, or similar material have been applied to a solid substrate such as marble, granite, or a synthetic rock-like substance in the form of a decal or overlay. Such products are not durable and will scratch, or the surface wear away.

It has now been discovered that an actual inlay into a solid synthetic rock-like substance can be produced from any image which is capable of being photographed.

Photosensitive polymers are well known in the art for use as printing plates. These plates generally consist of a flexible backing coated with a photosensitive polymer which may be a gelatin, albumen, gum arabic, glue or similar substance. Plates of later origin and preferred herein consist primarily of an emulsion of a polyvinyl alcohol or polyvinyl acetate or mixtures of the two along with a plasticizer such as dibutyl phthalate. These polymeric mixtures are sensitized to light by the addition of a light sensitizing agent such as a dichromate salt or a diazonium compound. These photosensitive polymeric printing plates are well-known and typical plates are described in patents such as U.S. Pat. Nos. 163,514; 473,753; 2,174,629; 2,709,654; 3,189,451 and 3,280,734 and British Pat. No. 1,334,464. Since photopolymeric plates are well known in the art a detailed discussion of their properties is not considered necessary. Basically, these plates are exposed to a negative and the portion of the photopolymeric plate exposed to the light becomes hardened or rendered insoluble by the sensitizing agent. The plate is then developed by washing away the unexposed portions with a solvent which may be either an organic or aqueous solvent depending upon the chemical composition of the plate used. The non-sensitized portion of the plate is dissolved leaving a relief image attached to the flexible backing which can then be used as a printing plate.

In the present invention these plates are used in an entirely different manner. Especially preferred are the plates disclosed in the above mentioned British Pat. No. 1,334,464. These plates consist of a polyvinyl acetate base containing minor amounts by weight of polyvinyl alcohol, dibutyl phthalate plasticizer, a blue dye and a dichromate salt sensitizer.

According to the present invention, it has been discovered that photopolymeric printing plates can be imbedded into a synthetic rock-like structure and the flexible backing of the printing plate removed thereby producing a solid rock-like structure having imbedded therein the photopolymeric image. This product, and the process of making the same, are both considered to be novel and will be described in detail herein.

DETAILED DESCRIPTION OF THE INVENTION

The invention can perhaps be best described by the method by which it is made. A photopolymeric printing plate with a flexible backing which has been exposed and developed so as to produce a relief image having a depth on the order of about 0.004 to 0.020 inches is placed in a mold or other appropriate position and fixedly attached so as to remain firmly in position. The plate is then coated with a thin gel coat of from about 0.01 to 0.02 inches of a resilient polyester resin. The gel coat may be applied by spraying, brushing or pouring. The plate is allowed to stand under ambient conditions for a sufficient length of time for the gel coat to set up or cure. Depending upon conditions and materials used this will ordinarily take from 2 to 24 hours.

A base or matrix comprising a mixture of a filler in a thermosetting or casting resin is then poured over the coated plate to the desired depth. Obviously, a mould is helpful under these conditions, but any other method of applying the matrix mixture to the plate would also be acceptable. The relief image from the plate is imbedded in the filler-thermosetting resin mixture, which is then allowed to cure or harden. During this procedure it may be desirable to apply pressure in the form of a weight or press to the mole to eliminate any warpage in the matrix covered plate. The matrix covered plate is then left in this condition for sufficient time for the matrix to gel and then thoroughly cure or harden. The hardened matrix thus becomes a synthetic rock-like material, which may be cut, drilled, sanded or treated in every respect as a rock. The coated photopolymeric plate is imbedded into the surface of the solid synthetic rock-like matrix, but still contains the flexible printing plate backing.

In order to remove the plate, the matrix containing the imbedded photopolymeric image is placed in an atmosphere where the temperature is lowered sufficiently to reduce the temperature at the flexible backing—resilient resin-photopolymeric interface to a temperature of 30°F. or lower. Preferably the temperature is lowered to 0° to 10°F. The backing is then quickly warmed and immediately peeled free from the resilient resin photopolymeric surface to produce a solid photopolymeric image inlay imbedded in the resilient resin coated synthetic rock-like matrix.

The article is then ready for the finishing steps and may be sawed, drilled, sanded, polished or treated in any manner to produce the desired shape.

The resilient polyester resin is resistant to ordinary water soluble food coloring dyes. However, the photopolymeric material is susceptible to dyeing with these dyes and different colors may be applied to the photopolymeric image. In general, any good quality food dye may be used. The product thus produced may then be coated with an acrylic resin or similar material and waxed or polished to produce a finished product ready for sale, framing, etc.

Other modifications can be used to make the product more attractive from a commercial point of view. For example, after the photopolymeric printing plate has been coated with the resilient polyester resin, a marble veined effect can then be added so that when the finely divided mineral-casting resin mixture is poured over it, the final product will have a marble-like effect. This veining process may be accomplished by conventional means such as by partially mixing a dye with the marble mixture prior to casting.

It is preferable to fill the molds, or whatever medium is used, with the mineral-casting resin mixture to a depth of about ⅜ to ⅝ of an inch. However, products having greater or lesser thicknesses may also be used without departing from the scope of the invention.

The polyester resins used as the gel coat and to prepare the synthetic rock mixture are well known and are commercially available under a host of trade names. Because each resin is considered to be proprietary by its manufacturer a complete chemical description of such resins is unobtainable. There are literally thousands of resin combinations used for gel coats and as casting resins. Any of these resins may be used and the specific resin formulation is not an essential part of the invention.

The majority of the resins as used herein are classified as "polyester resins". This term as commonly used encompasses an extremely broad field of polycondensation products of dicarboxylic acids with dihydroxy alcohols, which in the presence of a promoter or curing agent react with an unsaturated monomer to form a crosslinked thermosetting polyester resin.

The molecular weight of the polyester resin and its physical properties will depend upon the degree of polymerization, the addition of modifiers and inhibitors, temperatures of polymerization and reactivity of ingredients. Such a discussion is beyond the scope of this disclosure as commercial resins are available which require only the addition of the promoter to bring about crosslinking and curing.

In the manufacture of polyester condensates it is preferred to condense unsaturated dibasic acids or their anhydrides with polyhydric alcohols such as the glycols. Maleic and fumaric acids are the most important unsaturated acids used. Other unsaturated acids include citraconic acid, itaconic acid, hexachloroendomethylene tetrahydrophthalic acid and endomethylene tetrahydrophthalic acid.

The unsaturated acids may be modified by saturated aromatic or aliphatic di- or polybasic acids or anhydrides which result in more resilient or flexible higher molecular weight resins. Included in such acids are phthalic acid, isophthalic acid, succinic acid, adipic acid, malonic acid, sebacic acid, glutaric acid, pimelic acid, sorbic acid and azelaic acid.

The polyhydric alcohols react with the above mentioned acids through condensation to form the polyester groupings having an average molecular weight of about 800 to 5000. Varying the relationship of acids and alcohols provide control over the molecular weight. Exemplary of the alcohols used are glycerol, ethylene glycol, penterythritol, propylene glycol, butanediol-1,4, diethylene glycol, bisphenol A, hydrogenated bisphenol A, neopentyl glycol, (butylene glycol-2,3; 1,4; 1,3), pentanediol-1,5, triethylene glycol, dipropylene glycol, tripropylene glycol and isopropylidene bis (p-phenyleneoxpropanol-2). Theoretically one equivalent of acid requires one equivalent of alcohol for complete esterification. However, in practical application a small excess of the alcohol is often used.

The polycondensation products thus obtained are mixed with from 5 to 50% by weight of an unsaturated monomer which, when the resin is cured, will be addition polymerization cross linked with the polyester to form a thermoset resin. The most commonly used monomer is styrene, however other monomers such as methyl methacrylate, vinyl toluene, alpha methyl styrene, dichlorostyrene, divinyl benzene, diallyl phthalate and triallyl cyanurate may also be used.

The polyester-monomer mixture is liquid and may be stored and shipped as such.

In making the resilient polyester coating or synthetic rock material a promotor or catalyzing agent is added in an amount of from about 0.1 to 1.5% by weight based on resin content to a polyester-monomer or polyester-monomer-filler mixture and thoroughly mixed avoiding the formation of air bubbles in the mixture. Preferred promoters or curing agents are the peroxides such as benzoyl peroxide, acetyl peroxide, methyl ethyl ketone peroxide, t-butyl peroxide, lauroyl peroxide, bis (1-hydroxycyclohexyl) peroxide, t-butyl perbenzoate, di-t-butyl peroxide and cyclohexanone peroxide. Copromoters such as cobalt naphthenate, dimethyl aniline, N, N -diethyl aniline and the like may be used.

In general the resins used in this application will cure or set-up at room temperature. The curing step is exothermic and the amount of heat generated will be a function of the polyester condensate, unsaturated monomer and promoter used. The addition of a filler will lower the peak exothermic during curing since the filler helps to absorb the heat of reaction and may extend the curing time. In preparing synthetic rock-like products a major portion of the product will be a filler or combination of fillers.

The resins used for the preparation of the synthetic rock-like products must be capable of high filler loading. The resin will generally comprise about 10 to 40% by weight of the product and the filler about 60 to 90% by weight.

The filler used to prepare the synthetic base or matrix may be any of the conventionally used fillers such as crushed or powdered marble, slate and granite; glass products in the form of solid spheres, cellular nodules, hollow spheres, flake and granules; carbon products such as carbon black and ground petroleum coke; cellulosic fillers such as wood chips, wood flour, cork and shell flour; calcium and magnesium carbonates such as dolomite, chalk, limestone and the like; metal flakes and powders such as aluminum, bronze, lead, stainless steel, copper and zinc; metallic oxides such as oxides of aluminum, antimony, beryllium and magnesium; silica products and silicates such as diatomaceous earth, quartz, sand, kaoline, tripoli, asbestos, kaolinite, mica, talc, wollastonite, rottenstone, bentonite, feldsper, fullers earth, pumice and vermiculite.

The synthetic rock-like structure is prepared by first mixing together the filler and polyester condensates - monomer mixture and then adding the promoter or curing agent. The mixture is then poured into the mold before gelation and allowed to cure or harden.

While the exact chemical composition of the photopolymeric printing plate used in this invention is not critical, it is important that the plate be developed to the extent that only the image to be inlaid into the synthetic rock-like matrix remain on the plate. In other words, during the developing process all unexposed portions of the plate must be removed baring the surface of the flexible backing in all places except where the relief image is attached. This, of course, may be accomplished by the commercial developing methods now practiced in the art. Because of the ease of preparation and practicability the plate disclosed in British Pat. No. 1,334,464 is again preferred.

The invention will now be described with reference to the following examples. It is to be kept in mind, however, that these are exemplary only and are not intended to define the scope of the invention.

EXAMPLE

A commercial photopolymeric plate having a flexible aluminum backing containing a photopolymeric emulsion of a polyvinyl acetate having dispersed therein minor amounts of a polyvinyl alcohol, dibutylphthalate plasticizer, a dichromate salt sensitizer and a blue dyestuff was exposed to a negative under actinic light and then developed by washing with water. The unexposed portions of the photopolymeric plate were thus washed away leaving exposed the flexible aluminum backing having attached thereto the photopolymeric relief image having an average depth of approximately 0.020 inches. After drying, this plate was placed in a mold and secured thereto. A thin layer of approximately 0.010 – 0.020 of a resilient polyester resin (Cook, Paint and Varnish 945 × 002 Clear Marble Gel Coat) was coated over the exposed surfaces of the plate and relief image. This resilient resin was allowed to set until cured, which took approximately 12 hours under ambient conditions. A mixture was then prepared by mixing about 4 parts by weight of a finely divided dolomite with about 1 part by weight of a polyester resin (Stepan Chemical Company Marble Resin No. 5915) and adding 0.06 percent by weight based on the resin of methyl ethyl ketone peroxide as a catalyzing agent. This mixture was poured over the coated plate in the mold to a depth of about ½ inch and was then weighted to eliminate curl and warpage until the mixture had hardened. The material was thus left in this condition for approximately 24 hours. The material was then removed from the mold and placed in a freezer with the flexible backing still attached to the solidified matrix until the temperature at the interface of the resilient polyester, photopolymer flexible backing was about 0–10°F. The plate was then quickly rubbed with a warm damp cloth at the flexible backing surface. The backing was then immediately peeled free from the matrix to yield a hardened photopolymeric relief image plate imbedded into the flexible polyester resin coated matrix.

The inlaid product was then shaped as necessary including sawing or cutting away the unwanted solidified matrix, sanding and buffing the edges and corners. A food dye was then placed over the inlaid portion of the product. The photopolymer was susceptible to the dye, however, the resilient polyester coating was dye resistant. In other words, the coloring was absorbed by the inlaid material, but rejected by the polyester resin coat. After dyeing, the material was coated with a final coating of an acrylic resin and then waxed to a high shine to produce an ornamental image.

We claim:

1. A solid photopolymeric image inlay article comprising a solidified synthetic rock-like matrix of a mixture of a filler material and a thermosetting resin coated with a thin layer of a resilient polyester resin said coated matrix having inlaid therein a photopolymeric image.

2. The article according to claim 1 wherein the resilient polyester coating layer is from 0.010 to 0.020 inches thick.

3. The article according to claim 2 wherein the photopolymeric image inlay is from 0.004 to 0.020 inches thick.

4. The article according to claim 3 wherein the filler material is a mineral.

5. The article according to claim 3 wherein the thermosetting resin is a crosslinked polyester resin.

6. The article according to claim 4 wherein the mineral is a carbonate of magnesium and calcium.

7. The article according to claim 6 wherein the mineral is dolomite.

8. The article according to claim 7 wherein the rock-like matrix has the appearance of marble.

9. The article according to claim 8 wherein the photopolymeric image is made up of a mixture comprising polyvinyl acetate, polyvinyl alcohol, and dibutyl phthalate.

10. The article according to claim 5 wherein the crosslinked polyester resin contains about 50–95% by of a polyester condensate and 5–50% by weight of styrene as the crosslinking monomer.

* * * * *